United States Patent
Otremba et al.

(10) Patent No.: US 7,851,908 B2
(45) Date of Patent: Dec. 14, 2010

(54) SEMICONDUCTOR DEVICE

(75) Inventors: Ralf Otremba, Kaufbeuren (DE); Xaver Schloegel, Sachsenkam (DE); Josef Hoeglauer, Munich (DE); Erwin Huber, Munich (DE)

(73) Assignee: Infineon Technologies AG, Neubiberg (DE)

( * ) Notice: Subject to any disclaimer, the term of this patent is extended or adjusted under 35 U.S.C. 154(b) by 403 days.

(21) Appl. No.: 11/768,972

(22) Filed: Jun. 27, 2007

(65) Prior Publication Data

US 2009/0001562 A1      Jan. 1, 2009

(51) Int. Cl.
*H01L 23/24* (2006.01)
*H01L 23/48* (2006.01)
*H01L 23/34* (2006.01)
*H01L 23/52* (2006.01)
*H01L 29/40* (2006.01)

(52) U.S. Cl. .................. 257/724; 257/687; 257/690; 257/723; 257/752

(58) Field of Classification Search ................ 257/753, 257/323, 363, 502
See application file for complete search history.

(56) References Cited

U.S. PATENT DOCUMENTS

| 5,332,921 | A  | * | 7/1994  | Dousen et al. ............. 257/685 |
| 6,306,680 | B1 |   | 10/2001 | Fillion et al. |
| 6,442,033 | B1 | * | 8/2002  | Liu et al. .................... 361/743 |
| 6,703,698 | B2 |   | 3/2004  | Huang et al. |
| 6,835,580 | B1 |   | 12/2004 | Knapp et al. |
| 7,091,620 | B2 | * | 8/2006  | Miyazaki et al. ............ 257/778 |
| 7,138,706 | B2 | * | 11/2006 | Arai et al. ................... 257/678 |
| 2004/0063240 | A1 |   | 4/2004  | Madrid et al. |
| 2005/0127500 | A1 |   | 6/2005  | Colgan et al. |
| 2006/0022298 | A1 | * | 2/2006  | Shiraishi et al. ............ 257/509 |
| 2007/0040187 | A1 | * | 2/2007  | Koike et al. ................ 257/177 |
| 2008/0111224 | A1 | * | 5/2008  | Byun et al. ................. 257/686 |

FOREIGN PATENT DOCUMENTS

| DE | 10003671     | 8/2000 |
| DE | 102004037085 | 3/2005 |
| DE | 112004000564 | 3/2006 |

OTHER PUBLICATIONS

Sawle et al., "Novel Power MOSFET Packaging Technology Doubles Power Density in Synchronous Buck Converters for Next Generation Microprocessors," International Rectifier, APEC 2002.

* cited by examiner

*Primary Examiner*—Edward Wojciechowicz
(74) *Attorney, Agent, or Firm*—Dicke, Billig & Czaja, PLLC

(57) ABSTRACT

A semiconductor device is disclosed. One embodiment provides a module including a first carrier having a first mounting surface and a second mounting surface, a first semiconductor chip mounted onto the first mounting surface of the first carrier and having a first surface facing away from the first carrier, a first connection element connected to the first surface of the first semiconductor chip, a second semiconductor chip having a first surface facing away from the first carrier, a second connection element connected to the first surface of the second semiconductor chip, and a mold material covering the first connection element and the second connection element only partially.

17 Claims, 4 Drawing Sheets

A-A'

A-A'

SEMICONDUCTOR DEVICE

BACKGROUND

This invention relates to a semiconductor device and a method of assembling thereof.

Power semiconductor chips may, for example, be integrated into semiconductor devices. Power semiconductor chips are suitable in particular for the switching or control of currents and/or voltages.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
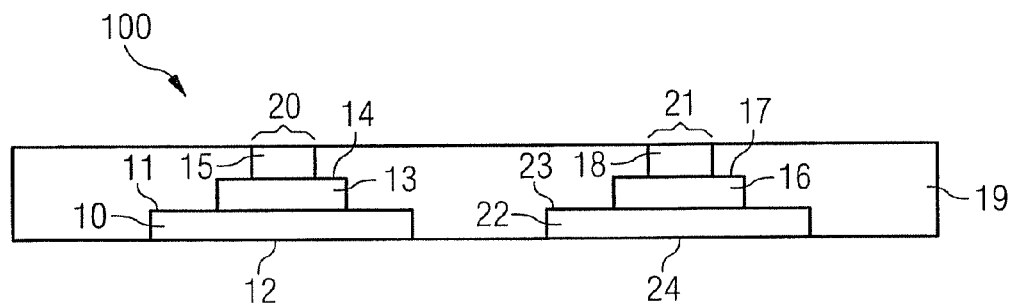
FIG. 1 schematically illustrates a module 100 according to an exemplary embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

In the following embodiments of the invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of these specific details. The following description is therefore not to be taken in a limiting sense, and the scope of the invention is defined by the appended claims.

Modules with a semiconductor chip applied to a carrier are described below. The carrier may be of any shape, size or material. During the fabrication of the module the carrier may be provided in a way that other carriers are arranged in the vicinity and are connected by connection means to said carrier with the purpose of separating said carriers. The carrier may be fabricated from metals or metal alloys, in particular copper, copper alloys, aluminum, aluminum alloys, or other materials. It may further be electrically conductive. The carrier may be, for example, a lead-frame or a part of a lead-frame, such as a die pad. The carrier may have mounting surfaces. The mounting surfaces may serve to mount the carrier onto another component or may serve to mount another component onto the carrier. The mounting surfaces may be internal or external mounting surfaces. External mounting surfaces allow to mount the modules to external components, such as circuit boards for example.

The semiconductor chips described below may be of extremely different types and may include for example integrated electrical or electro-optical circuits. The semiconductor chips may be, for example, configured as power transistors, power diodes, control circuits, microprocessors or microelectromechanical components. In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in particular on its two main surfaces, that is to say on its top side and bottom side. In particular, power transistors and power diodes may have a vertical structure. By way of example, the source terminal and gate terminal of a power transistor and the anode terminal of a power diode may be situated on one main surface, while the drain terminal of the power transistor and the cathode terminal of the power diode are arranged on the other main surface. A power diode may be embodied in particular as a Schottky diode. Furthermore, the modules described below may include integrated circuits to control the integrated circuits of other semiconductor chips, for example, the integrated circuits of power transistors or power diodes. The semiconductor chips need not be manufactured from specific semiconductor material and, furthermore, may contain inorganic and/or organic materials that are not semiconductors, such as for example insulators, plastics or metals. Moreover, the semiconductor chips may be packaged or unpackaged.

The modules described below include connection elements or connection structures. The connection elements or connection structures may allow electrical contact to be made with the semiconductor chips, for example from outside the module. The connection elements and connection structures may also connect the semiconductor chips with each other. Furthermore, the connection elements and connection structures may be thermally conductive and may serve as heat sinks for dissipating the heat generated by the semiconductor chips. The connection elements and connection structures may have contact surfaces to be connected to an external heat sink. The connection elements and connection structure may be composed of one or two or more individual elements. For example, a connection structure may be composed of a conductive layer and a carrier, or it may be composed of a clip and a carrier. The connection elements and connection structures may be composed of any desired electrically conductive material, for example of a metal, such as aluminum, gold or copper, a metal alloy or an electrically conductive organic material. The connection elements and connection structures may, for example, include conductive layers or conductive clips.

The modules may include a mold material covering at least parts of the components of the modules. The mold material may be any appropriate thermoplastic or thermosetting material. Various techniques may be employed to cover the components with the mold material, for example compression molding or injection molding.

FIG. 1 illustrates a module 100 in a cross section as an exemplary embodiment. The module 100 includes a first carrier 10, which has a first mounting surface 11 and a second mounting surface 12. A first semiconductor chip 13 is mounted onto the first mounting surface 11. Furthermore, the first semiconductor chip 13 has a first surface 14, which faces away from the first carrier 10. A connection element 15 is connected to the first surface 14 of the first semiconductor chip 13.

Moreover, the module 100 includes a second semiconductor chip 16, which has a first surface 17 facing in the same direction as the first surface 14 of the first semiconductor chip 13. A second connection element 18 is connected to the first surface 17 of the second semiconductor chip 16. The connection elements 15 and 18 may be electrically disconnected from each other. A mold material 19 covers the first connection element 15 and the second connection element 18 only partially. For example, a first region 20 of the first connection element 15 and a first region 21 of the second connection element 18 may be left uncovered by the mold material 19. The module 100 may also contain a second carrier 22, which has a first mounting surface 23 and a second mounting surface 24. The second semiconductor chip 16 may be mounted onto the first mounting surface 23. The mold material 19 may also cover the semiconductor chips 13 and 16 as well as the carriers 10 and 22. The second mounting surfaces 12 and 24 of the carriers 10 and 22 or parts of them may not be covered by the mold material 19 and may serve as external mounting surfaces to mount the module 100 onto external components.

The first regions 20 and 21 of the connection elements 15 and 18 as well as the second surfaces 12 and 24 of the carriers 10 and 22 may be used to couple them to other components. This is exemplarily illustrated in FIG. 2. There, an excerpt of a device 200 is schematically illustrated which includes the module 100 that is mounted onto a circuit board 25, for example a PCB (Printed Circuit Board). The second surfaces 12 and 24 of the carriers 10 and 22 may have been soldered to contact areas of the circuit board 25. In this case the second surfaces 12 and 24 serve as external electrical contact elements allowing electrical contact to be made to the semiconductor chips 13 and 16.

On top of the module 100, a heat sink or cooling element 26 may be attached. The heat sink 26 may be thermally coupled (not necessarily electrically) to the first regions 20 and 21 of the connection elements 15 and 18. In this case, the connection elements 15 and 18 may not only make electrical connections to the semiconductor chips 13 and 16, but may in addition help to transfer the heat generated by the semiconductor chips 13 and 16 to the heat sink 26, which dissipates the generated heat.

Figure 3:
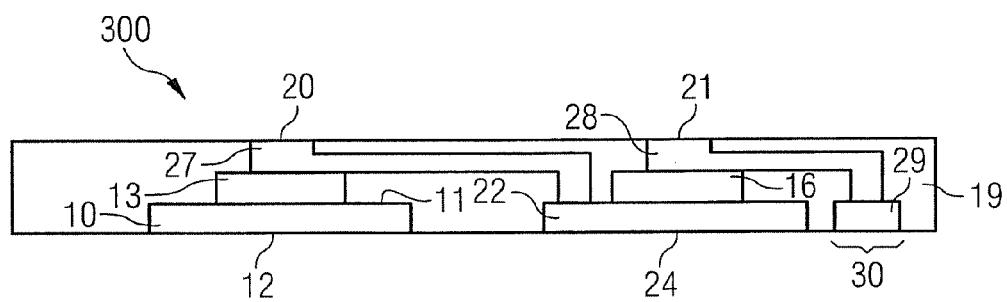
FIG. 3 schematically illustrates a module 300 according to an exemplary embodiment.

FIG. 3 illustrates a module 300 in a cross section as a further exemplary embodiment. Apart from the first carrier 10, the first semiconductor chip 13, the second semiconductor chip 16 and the mold material 19, the module 300 includes a first connection structure 22, 27 and a second connection structure 28, 29. The first connection structure 22, 27 is connected to the first surface 14 of the first semiconductor chip 13, and the second connection structure 28, 29 is connected to the first surface 17 of the second semiconductor chip 16. The mold material 19 covers both connection structures 22, 27 and 28, 29, but leaves first regions 20 and 21 as well as second regions 24 and 30 of the connection structures 22, 27 and 28, 29 uncovered.

The first regions 20 and 21 may serve to conduct heat, the second regions 24 and 30 may serve to establish electrical connections with other components.

Each of the connection structures 22, 27 and 28, 29 may consist of one or more elements. For example, the first connection structure 22, 27 may consist of a first connection element 27 and the second carrier 22, wherein the first connection element 27 may be electrically connected to the first mounting surface 23 of the second carrier 22. The second connection structure 28, 29 may consist of a second connection element 28 and a pin 29, which are electrically connected with each other. In this case, the first regions 20 and 21, which are not covered with the mold material 19, are surfaces of the connection elements 27 and 28, and the second uncovered regions 24 and 30 are the second mounting surface 24 of the second carrier 22 and the surface 30 of the pin 29.

Figure 2:
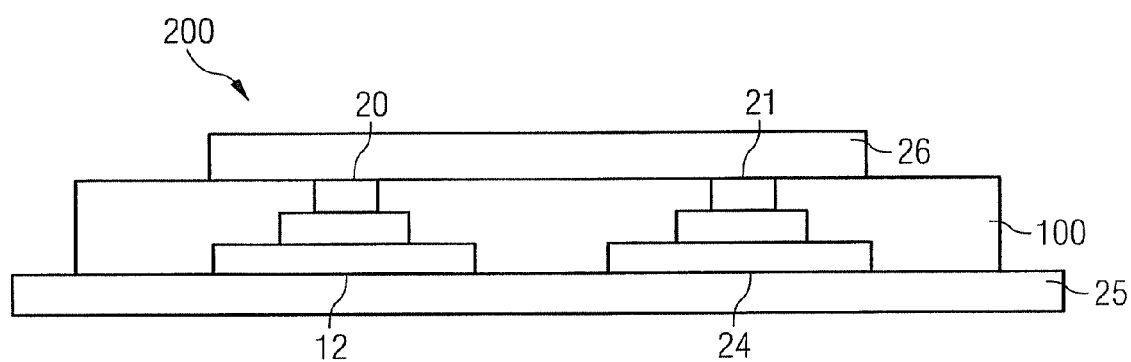
FIG. 2 schematically illustrates a device 200 according to an exemplary embodiment.

Similar to the device 200 illustrated in FIG. 2, the module 300 may be mounted onto a circuit board, wherein the second regions 24 and 30 as well as the second mounting surface 12 may be soldered to contact areas of the circuit board to establish electrical connections. Furthermore, a heat sink may be placed on top of the module 300, wherein the first regions 20 and 21 may be thermally coupled to the heat sink to dissipate the heat generated by the semiconductor chips 13 and 16.

Figure 4:
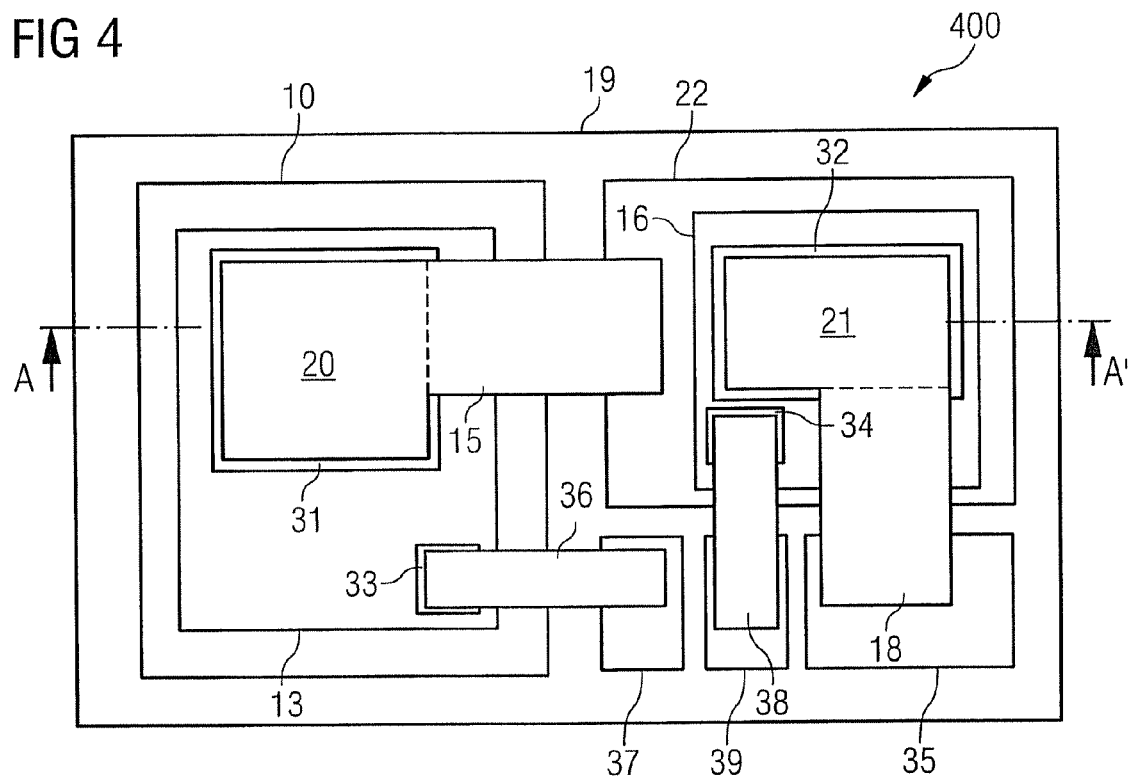
FIG. 4 schematically illustrates a module 400 in a plan view according to an exemplary embodiment.

FIG. 4 illustrates a module 400 in a plan view as a further exemplary embodiment. The module 400 is an implementation of the modules 100 and 300 illustrated in FIGS. 1 and 3. The module 400 includes a first carrier 10, on which a first semiconductor chip 13 is attached, and a second carrier 22, on which a second semiconductor chip 16 is attached. The carriers 10 and 22 may be fabricated from a metal, such as copper, iron, nickel or aluminum, or a metal alloy or another electrically conductive material.

Each of the semiconductor chips 13 and 16 may be a vertical power semiconductor, in particular a power transistor or a power diode. In case of the semiconductor chips 13 and 16 being power transistors, their drain electrodes may be electrically connected to the carriers 10 and 22, respectively. On the main surfaces of the semiconductor chips 13 and 16 facing away from the carriers 10 and 22, source electrodes 31 and 32 as well as gate electrodes 33 and 34 are placed. The first connection element 15 electrically connects the source electrode 31 of the first semiconductor chip 13 to the second carrier 22. The second connection element 18 electrically connects the source electrode 32 of the second semiconductor chip 16 to a pin 35.

A connection element 36 electrically connects the gate electrode 33 of the first semiconductor chip 13 to a pin 37. A connection element 38 electrically connects the gate electrode 34 of the second semiconductor chip 16 to a pin 39. Each of the pins 35, 37 and 39 may have at least one surface which is not covered with the mold material 19 allowing electrical connections to be made to external components. The module 400 may also contain a further semiconductor chip to control the semiconductor chips 13 and 16, in particular their gate electrode potentials.

Figure 5:
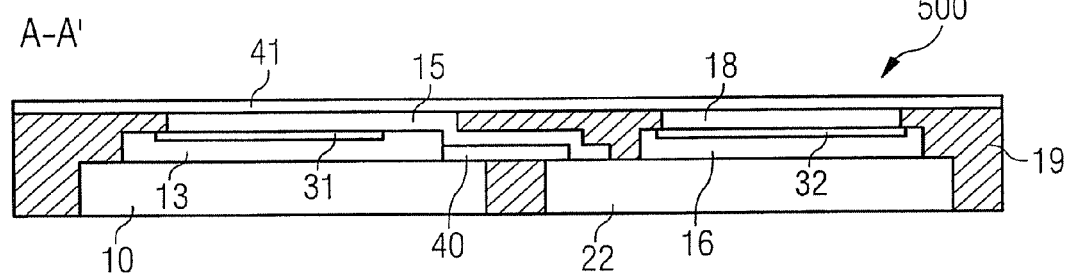
FIG. 5 schematically illustrates a module 500 in a cross section according to an exemplary embodiment.

FIG. 5 illustrates a module 500 which is an exemplary embodiment of the module 400 illustrated in cross section along the line A-A' depicted in FIG. 4. The module 500 includes an electrically insulating layer 40 deposited on top of the first carrier 10 and the second carrier 22. The electrically insulating layer 40 bridges the gap between the two carriers 10 and 22 so that the first connection element 15 in form of an electrically conductive layer can be deposited on top of the electrically insulating layer 40.

Similar to the electrically insulating layer 40, further electrically insulating layers may be provided to bridge the gaps between the carriers 10 and 22 and the pins 35, 37, 39 so that the connection elements 18, 36 and 38 can be placed on these electrically insulating layers.

Furthermore, a further electrically insulating layer 41 is deposited on top of the two connection elements 15 and 18. The electrically insulating layer 41 may be thermally conductive. The insulating layer 41 prevents a heat sink or any other electrically conductive element arranged on top of the module 500 from short-circuiting the connection elements 15 and 18, but allows an energy transfer of the heat generated by the semiconductor chips 13 and 16. Furthermore, the electrically insulating layer 41 may prevent corrosion of the connection elements 15 and 18. If the module 500 is mounted on a circuit board and a heat sink is attached to the top side of the module 500, the heat generated by the semiconductor chips 13 and 16 may dissipate via the top side rather than the bottom side of the module 500.

The surface areas of the first regions 20 and 21, which are not covered with the mold material 19 may be in the range from 0.1 to 100 mm$^2$, in particular from 1 to 10 mm$^2$.

Figure 6:
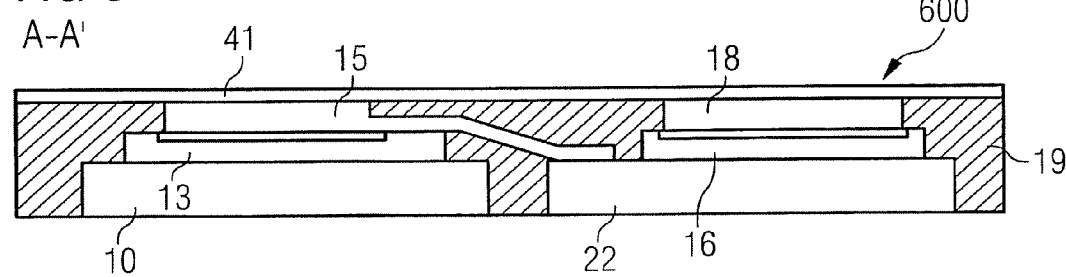
FIG. 6 schematically illustrates a module 600 in a cross section according to an exemplary embodiment.

FIG. 6 illustrates a module 600 which is a further exemplary embodiment of the module 400 illustrated in cross section along the line A-A' depicted in FIG. 4. In contrast to the module 500, the module 600 does not contain an electrically insulating layer to bridge the gap between the carriers 10 and 22, but its first connection element 15 is implemented as a clip connecting the source electrode 31 of the first semiconductor chip 13 to the second carrier 22. The clip 15 may be fabricated from a metal, for example copper, iron or nickel, a metal alloy or any other electrically conductive material.

The modules 400 to 600 illustrated in FIGS. 4 to 6 are of the lead less type. Alternatively, it may also be provided that the modules 400 to 600 include pins extending out from the mold material 19 to serve as external contact elements.

In FIGS. 7A to 7F different stages of the fabrication of the module 500 are exemplarily illustrated. In order to manufacture the module 500, first the carriers 10 and 22 are provided (see FIG. 7A). The carriers 10 and 22 may be fabricated from a metal, such as copper, iron, nickel or aluminum, or a metal alloy or another electrically conductive material. The carriers 10 and 22 may, for example, be part of a lead frame. The power transistors 13 and 16 are mounted onto the carriers 10 and 22, respectively, with their drain electrodes facing the carriers 10 and 22 (see FIG. 7B). The drain electrodes may be electrically connected to the carriers 10 and 22.

The electrical connection between the drain electrodes of the power transistors 13 and 16 and the carriers 10 and 22 may, for example, be produced by reflow soldering, vacuum soldering, diffusion soldering or adhesive bonding by using a electrically conductive adhesive.

If diffusion soldering is used as a connecting technique, it is possible to use solder materials which lead to intermetallic phases after the end of the soldering operation at the interface between the carriers 10 and 22 and the power transistors 13 and 16 on account of interface diffusion processes. In this case, the use of AuSn, AgSn, CuSn, AgIn, AuIn or CuIn solders is conceivable, for example, for a copper or iron-nickel carrier. If the power transistors 13 and 16 are adhesively bonded to the carriers 10 and 22, it is possible to use conductive adhesives which may be based on epoxy resins and be enriched with gold, silver, nickel or copper in order to produce the electrical conductivity.

Figure 7A:
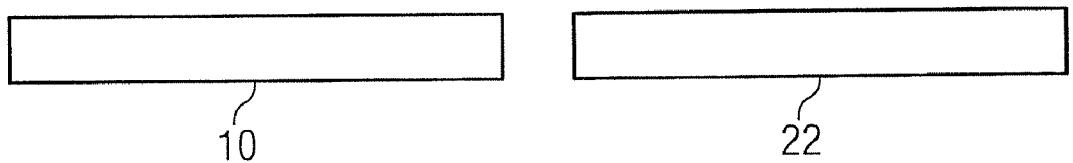
FIGS. 7A to 7F schematically illustrate an exemplary embodiment of a method to fabricate the module 500.
Figure 7B:
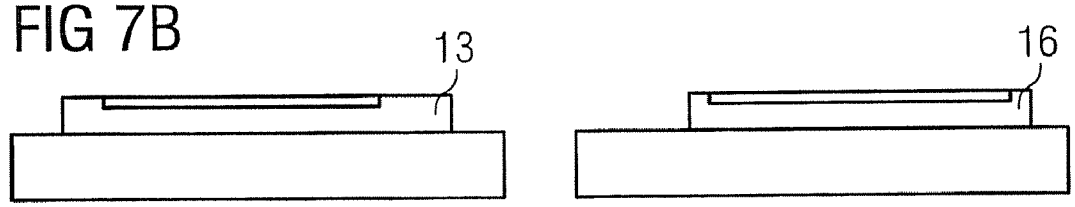
Figure 7C:
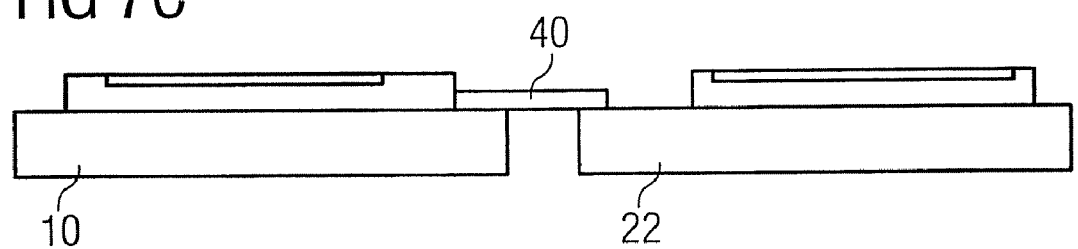

An electrically insulating foil 40 is deposited on top of the carriers 10 and 22 to bridge the gap between them (see FIG. 7C). The electrically insulating foil 40 may, for example, be laminated onto the carriers 10 and 22 and may be structured by a stamping process, laser ablation or any other suitable process known to a person skilled in the art. The electrically insulating foil 40 may be manufactured from a plastic or synthetic material or any other suitable material.

Figure 7D:
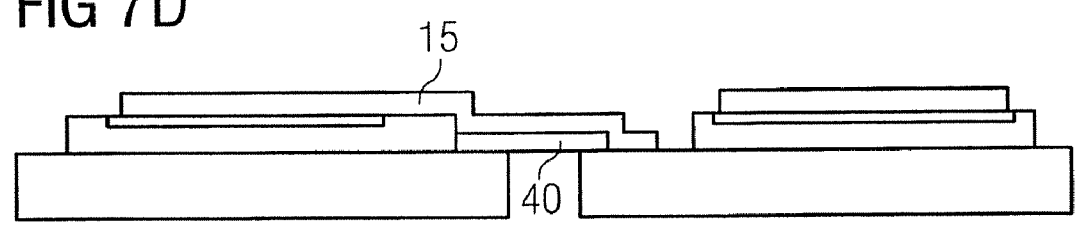

The electrically insulating foil 40 may act as a platform for the deposition of further layers, such as the first connection element 15 (see FIG. 7D). The first connection element 15 may consist of one or more electrically conducting layers. These layers may be generated by electroless and/or galvanic plating processes. Alternatively, other deposition methods, such as physical vapor deposition, chemical vapor deposition, sputtering, spin-on processes, spray depositing or ink jet printing may also be used. Copper, iron, nickel or other metals or metal alloys may be used as material. The thickness of the first connection element 15 may be in the range from 10 μm to 1 mm, in particular in the range from 50 μm to 150 μm.

Figure 7E:
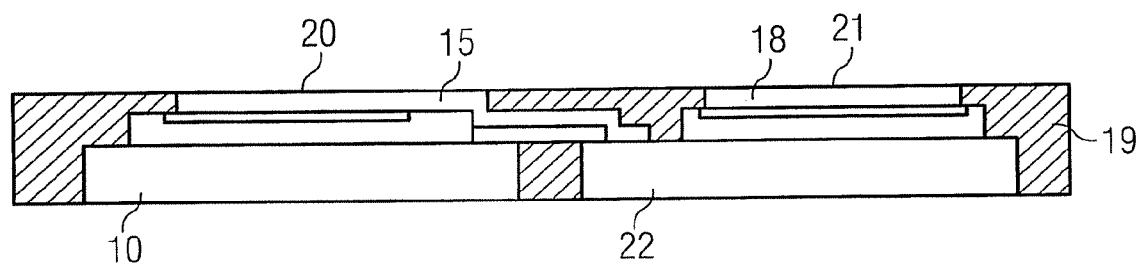
Figure 7F:
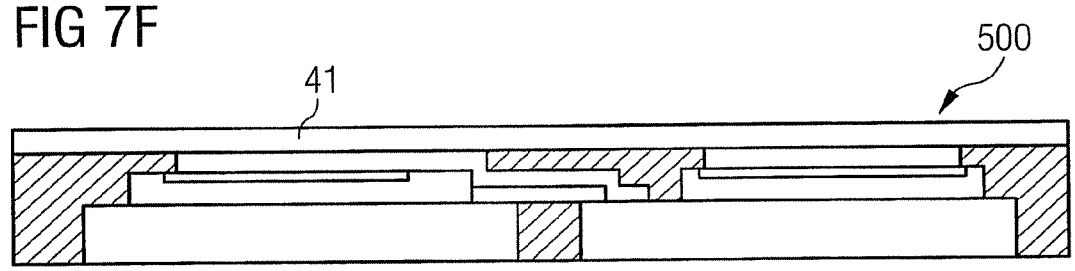

The mold material 19 is used to encapsulate the module 500 (see FIG. 7E). The mold material 19 may encapsulate any portion of the device 500, but leaves the first regions 20 and 21 of the connection elements 15 and 18 as well as the second mounting surfaces 12 and 24 of the carriers 10 and 22 uncovered. Furthermore, as illustrated in FIG. 7E surfaces of the connection elements 15 and 18 and a surface of the mold material 19 form a plane on the top side of the module 500. The same applies to the bottom side of the module 500 where surfaces of the carriers 10 and 22 and a surface of the mold material 19 form a plane. The mold material 19 may be composed of any appropriate thermoplastic or thermosetting material, in particular it may be composed of material commonly used in contemporary semiconductor packaging technology. Various techniques may be employed to cover the components of the device 500 with the mold material 19, for example compression molding or injection molding.

After the encapsulation of the module 500 with the mold material 19, the electrically insulating layer 41 is deposited on the top side of the module 500. The electrically insulating layer 41 may consist of any electrically insulating material, for example it may be fabricated from metal oxides, in particular aluminum oxide, silver oxide, titanium oxide, copper oxide, chromium oxide or zinc oxide, silicon oxide, diamond-like carbon, imides, organic materials, ceramic materials, glasses or polymers, such as parylene. The thickness of electrically insulating layer 41 may, for example, be in the range between 10 nm and 150 μm, in particular it may be in the range between 1 μm and 20 μm. The material and the thickness of the electrically insulating layer 41 may be chosen according to the application of the module 500, in particular the voltages applied to the connection elements 15 and 18. In case high voltages are applied to the connection elements 15 and 18, care should be taken to achieve sufficient electrical isolation.

Figure 8:
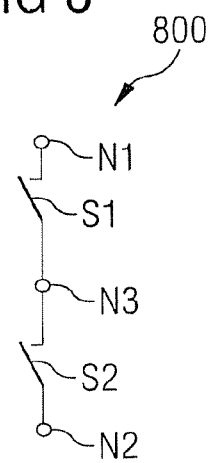
FIG. 8 illustrates a basic circuit of a half-bridge 800.

The modules 100 to 600 described above may, for example, be used as half-bridges. A basic circuit of a half-bridge 800 arranged between two knots N1 and N2 is illustrated in FIG. 8. The half-bridge 800 consists of two switches S1 and S2 connected in series. The semiconductor chips 13 and 16 may be implemented as the two switches S1 and S2. When compared to the module 400 illustrated in FIG. 4, the node N1 is the drain electrode of the first semiconductor chip 13, the node N3 arranged between the two switches S1 and S2 is the second carrier 22 and the node N3 is the source electrode of the second semiconductor chip 16.

The half-bridge 800 may, for example, be implemented in electronic circuits for converting DC voltages, DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A module, comprising:
   a first carrier having a first mounting surface and a second mounting surface;
   a first semiconductor chip mounted onto the first mounting surface of the first carrier and having a first surface facing away from the first carrier;
   a first connection element connected to the first surface of the first semiconductor chip;
   a second carrier having a first mounting surface and a second mounting surface;
   a second semiconductor chip mounted onto the first mounting surface of the second carrier and having a first surface facing away from the first carrier;
   a second connection element connected to the first surface of the second semiconductor chip;
   a mold material covering the first connection element and the second connection element only partially; and
   a first electrically insulating layer covering the first and second carriers so as to bridge a gap between them,
   wherein the mold material leaves a first region of the first connection element uncovered,
   wherein the mold material leaves a first region of the second connection element uncovered,
   wherein a second electrically insulating layer is arranged over the first region of the first connection element and the first region of the second connection element,
   wherein the second electrically insulating layer is thermally conductive, and
   wherein the second mounting surface of the first carrier and the second mounting surface of the second carrier are arranged in a common plane.

2. The module of claim 1, wherein the first connection element and/or the second connection element are clips or electrically conductive layers.

3. The module of claim 1, wherein the first connection element is connected to the second carrier.

4. The module of claim 1, wherein the second connection element is connected to the first carrier.

5. The module of claim 1, wherein the first connection element and the second connection element are electrically disconnected from each other.

6. The module of claim 1, wherein the first semiconductor chip and/or the second semiconductor chip are power semiconductors.

7. A device, comprising:
   a circuit board;
   a first carrier mounted onto the circuit board and having a first mounting surface facing away from the circuit board and a second mounting surface facing the circuit board;
   a second carrier mounted onto the circuit board and having a first mounting surface facing away from the circuit board and a second mounting surface facing the circuit board;
   a first electrically insulating layer covering the first and second carriers so as to bridge a gap between them;
   a first semiconductor chip mounted onto the first mounting surface of the first carrier and having a first surface facing away from the first carrier;
   a first connection element connected to the first surface of the first semiconductor chip;
   a second semiconductor chip having a first surface facing away from the first carrier, wherein the second semiconductor chip is mounted onto the first mounting surface of the second carrier;
   a second connection element connected to the first surface of the second semiconductor chip; and
   a mold material covering the first connection element and the second connection element only partially.

8. The device of claim 7, further comprising a heat sink arranged over the first connection element and/or the second connection element.

9. A module, comprising:
   a first carrier;
   a first semiconductor chip mounted onto the first carrier and having a first surface facing away from the first carrier;
   a first connection structure connected to the first surface of the first semiconductor chip;
   a second carrier;
   a second semiconductor chip mounted onto the second carrier and having a first surface facing away from the first carrier;
   a second connection structure comprising a second connection element and a pin, the second connection structure connected to the first surface of the second semiconductor chip; and a mold material covering the first connection structure and the second connection structure, wherein a first region and a second region of the first connection structure and a first region and a second region of the second connection structure are left uncovered; and a first electrically insulating layer covering the first and second carriers so as to bridge a gap between them, wherein the first connection structure and the second connection structure are electrically disconnected.

10. The module of claim 9, wherein the first connection structure comprise a first connection element and the second carrier.

11. The module of claim 9, wherein the first connection element and/or the second connection element are clips or electrically conductive layers.

12. The module of claim 9, wherein a second electrically insulating layer is arranged over the first regions of the first and second connection structures.

13. The module of claim 12, wherein the second electrically insulating layer is thermally conductive.

14. A method, comprising:

providing a first carrier having a first surface;

providing a second carrier having a first surface;

wherein a first electrically insulating layer is deposited on the first and second carriers bridging a gap between them;

positioning the first carrier and the second carrier such that the first surface of the first carrier and the first surface of the second carrier are in a common plane;

mounting a first semiconductor chip onto the first carrier;

mounting a second semiconductor chip onto the second carrier;

connecting the first semiconductor chip and the second carrier with a first connection element;

placing a second connection element over the second semiconductor chip; and covering the first connection element and the second connection element only partially with a mold material.

15. The method of claim 14, wherein an electrically conductive layer is deposited on the first electrically insulating layer.

16. The method of claim 14, wherein a second electrically insulating layer is deposited on the first and second connection elements.

17. A module, comprising:

a first carrier having a first mounting surface and a second mounting surface;

a first semiconductor chip mounted onto the first mounting surface of the first carrier and having a first surface facing away from the first carrier;

a first connection element connected to the first surface of the first semiconductor chip;

a second carrier having a first mounting surface and a second mounting surface;

a second semiconductor chip mounted onto the first mounting surface of the second carrier and having a first surface facing away from the first carrier;

a second connection element connected to the first surface of the second semiconductor chip;

a mold material covering the first connection element and the second connection element only partially; and a first electrically insulating layer covering the first and second carriers so as to bridge a gap between them, wherein the mold material leaves a first region of the first connection element uncovered, wherein the mold material leaves a first region of the second connection element uncovered, wherein a second electrically insulating layer is arranged over the first region of the first connection element, the first region of the second connection element, and the mold material which partially covers the first connection element and the second connection element, and wherein the second mounting surface of the first carrier and the second mounting surface of the second carrier are arranged in a common plane.

* * * * *